(12) United States Patent
Kim

(10) Patent No.: US 7,372,699 B2
(45) Date of Patent: May 13, 2008

(54) PLASMA DISPLAY APPARATUS

(75) Inventor: Ki-Jung Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 160 days.

(21) Appl. No.: 11/244,110

(22) Filed: Oct. 6, 2005

(65) Prior Publication Data

US 2006/0077620 A1    Apr. 13, 2006

(30) Foreign Application Priority Data

Oct. 11, 2004 (KR) .................. 10-2004-0080869
Oct. 11, 2004 (KR) .................. 10-2004-0080870

(51) Int. Cl.
*H05K 7/20* (2006.01)
*H01J 17/49* (2006.01)

(52) U.S. Cl. ............... 361/704; 361/707; 361/708; 361/715; 313/44; 313/583

(58) Field of Classification Search ............... None
See application file for complete search history.

(56) References Cited

U.S. PATENT DOCUMENTS 5,724,231 A    3/1998 Winick et al.

| 2003/0090458 | A1* | 5/2003 | Tajima | ............... 345/156 |
|---|---|---|---|---|
| 2003/0102789 | A1* | 6/2003 | Kim et al. | ............... 313/44 |
| 2003/0169573 | A1* | 9/2003 | Irie et al. | ............... 361/752 |
| 2004/0195969 | A1* | 10/2004 | Kim et al. | ............... 313/583 |
| 2005/0047067 | A1* | 3/2005 | Bang et al. | ............... 361/681 |
| 2005/0174301 | A1* | 8/2005 | Kim | ............... 345/3.1 |
| 2007/0018577 | A1* | 1/2007 | Hwang | ............... 313/582 |

FOREIGN PATENT DOCUMENTS

| JP | 2001-337611 | 12/2001 |
|---|---|---|
| JP | 2002-202729 | 7/2002 |
| JP | 2002-323863 | 11/2002 |
| KR | 10-2002-0081636 | 10/2002 |

* cited by examiner

*Primary Examiner*—Gregory D Thompson
(74) *Attorney, Agent, or Firm*—Robert E. Bushnell, Esq.

(57) ABSTRACT

A plasma display apparatus includes a Plasma Display Panel (PDP). A thermal conductive sheet is attached to one side of the PDP, and a chassis base is connected to the side of the PDP on which the thermal conductive sheet has been attached. The chassis base can be a planar plate having edge portions. At least one reinforcing unit is extends along and is attached to at least one of the edge portions of the chassis base.

25 Claims, 14 Drawing Sheets

PLASMA DISPLAY APPARATUS

CLAIM OF PRIORITY

This application makes reference to, incorporates the same herein, and claims all benefits accruing under 35 U.S.C. § 119 from two applications for PLASMA DISPLAY APPARATUS both of which were earlier filed in the Korean Intellectual Property Office on 11 Oct. 2004 and, there duly assigned Serial Nos. 10-2004-0080869 and 10-2004-0080870, respectively.

BACKGROUND OF THE INVENTION

1. Field of the Invention

The present invention relates to a plasma display apparatus. More particularly, the present invention relates to a plasma display apparatus in which a chassis base thereof is able to withstand bending and twisting loads and thereby maintain its flatness, and in which assembly and disassembly of the chassis base and a Plasma Display Panel (PDP) are easily performed.

2. Description of the Related Art

A plasma display apparatus includes: a Plasma Display Panel (PDP) that displays images using a plasma generated by a gas discharge, a chassis base that supports the PDP, and a circuit board assembly mounted on a side of the chassis base opposite to the side that is adjacent to the PDP. The circuit board assembly is electrically coupled to display electrodes and address electrodes positioned within the PDP via a Flexible Printed Circuit (FPC), connectors, or a Tape Carrier Package (TCP).

The PDP includes two glass substrates sealed opposing each other to thereby form a discharge space therebetween. As a result of this structure, the PDP is susceptible to damage from external shock. To ensure a sufficient mechanical strength of the PDP, it is necessary for the chassis base be resistant to bending and twisting loads.

Furthermore, a thermal conductive sheet is interposed between the chassis base and the PDP to transfer the heat of the PDP. To ensure close contact with the PDP, the chassis base must maintain a high degree of flatness. In addition, the chassis base is preferably light in weight so that the overall weight of the plasma display apparatus is minimally increased.

A chassis base made by pressing a thin plate has been used in an effort to satisfy all of the above requirements. To ensure a sufficient strength with respect to various loads, ends of the planar chassis base are bent into an "L" shape, and a plurality of reinforcing units are attached at suitable locations to a rear surface of the chassis base. A sufficient strength and a low weight of the chassis base can be realized by such a configuration.

The reinforcing units are attached to the side of the chassis base on which the circuit board assembly is arranged with screws or a sheet metal fastening method, such as the TOX method. Accordingly, the chassis base is partially deformed during the bending process due to the concentration of stresses in the end portions thereof, to thereby reduce the flatness of the chassis base. Therefore, following the bending process and the mounting of the reinforcing units, an additional step is required to again flatten the chassis base.

The chassis base and the PDP are interconnected as described above. If either the chassis base or the PDP in a plasma display apparatus is found to be defective, it must be discarded. The chassis base and the PDP must therefore be disassembled so as to reuse one of the two elements and discard the other.

To disassemble the PDP and the chassis base, a bracket is provided on the chassis base, and two-sided tape is provided on the bracket. That is, the bracket is removably mounted on the chassis base by screws, and the two-sided tape interconnects the bracket and the PDP. With this structure, by removing the screws, the bracket is separated from the chassis base and is attached to the PDP by the two-sided tape. Hence, the chassis base and the PDP can be separated from each other.

In the plasma display apparatus described above, to ensure the strength of the chassis base, the outer portions of the chassis base are bent to form reinforcing units. Furthermore, to form an assembly/disassembly structure between the chassis base and the PDP, the reinforcing units, a separate bracket, and screws are provided. As a result, manufacturing of the chassis base and its configuration become complicated.

SUMMARY OF THE INVENTION

In accordance with the present invention, a plasma display apparatus is provided in which a chassis base thereof is able to withstand bending and twisting loads, and thereby maintain its flatness, and in which assembly and disassembly of the chassis base and a PDP are easily performed.

A plasma display apparatus includes a plasma display panel (PDP); a thermal conductive sheet attached to one side of the PDP; a chassis base connected to the side of the PDP to which the thermal conductive sheet is attached, the chassis base being a planar plate having edge portions; and at least one reinforcing unit extending along and attached to at least one of the edge portions of the chassis base.

The chassis base is rectangular in shape having two long edge portions and two short edges portions, and a pair of the reinforcing units is preferably respectively attached to the two long edge portions of the chassis base. Each of the reinforcing units includes a connecting portion connected to the respective one of the edge portions of the chassis base, and a reinforcing portion formed in a bent configuration extending from the connecting portion in a direction away from PDP.

The connecting portion is U-shaped and connected to the respective one of the edge portions of the chassis base by being forcibly inserted over the edge portions so as to thereby support the edge portion on both sides thereof. The connecting portion is connected to the respective one of the edge portions using a fastener.

The reinforcing portion can include a parallel section that extends along a direction parallel to the PDP from an end of the connecting portion, and an end section that extends from the parallel section in a direction toward the chassis base. Also, the reinforcing portion can include a section that extends from an end of the connecting portion in a direction inclined with respect to a planar direction of the PDP.

The connecting portion is disposed between the PDP and the respective one of the edge portions of the chassis base, and is connected to the chassis base with a fastener. The reinforcing portion can includes a parallel section and/or an end section. In addition, the reinforcing portion can include an inclined section with respect to the planar direction of the PDP.

The plasma display apparatus further includes two-sided adhesive tape positioned between the PDP and the chassis base, and interposed between an outer periphery of the thermal conductive sheet and the connecting portion.

In another embodiment, a plasma display apparatus includes a Plasma Display Panel (PDP); a thermal conductive sheet attached to one side of the PDP; a chassis base connected to the side of the PDP to which the thermal conductive sheet is attached, the chassis base having four edge portions; at least one reinforcing unit attached to at least one of the edge portions of the chassis base with a fastener; and an attachment member interposed between the reinforcing unit and the PDP facing the reinforcing unit, and positioned to the outside of the thermal conductive sheet. The chassis base is a planar plate.

The reinforcing unit includes a connecting portion connected to the respective one of the edge portions of the chassis base with a fastener, and a bent reinforcing portion extending from the connecting portion in a direction away from the PDP.

The attachment member is interposed between the connecting portion and the PDP facing the connection portion.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Exemplary embodiments of the present invention are described in detail below with reference to the drawings.

Figure 1:
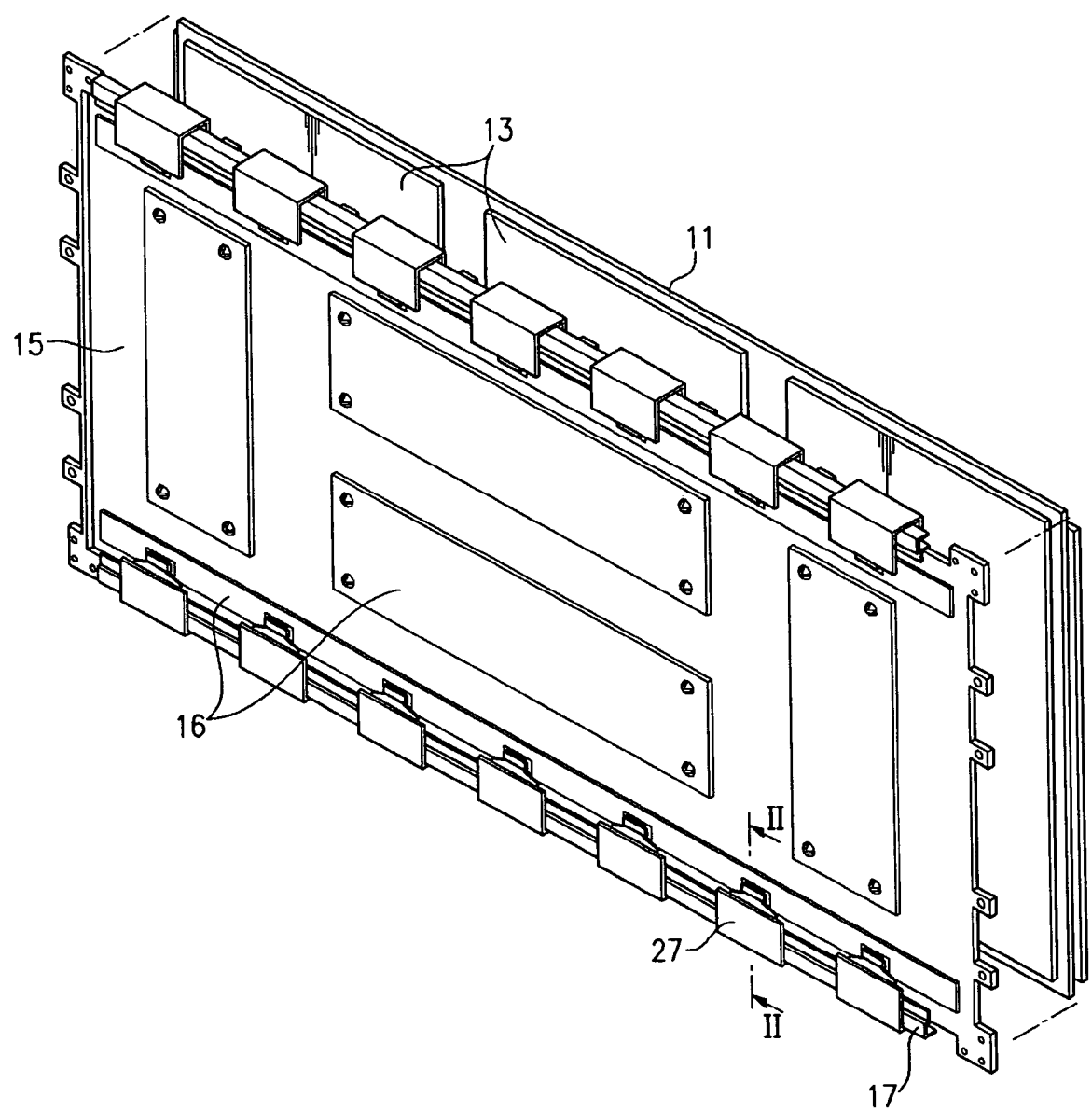
FIG. 1 is an exploded perspective view of a plasma display apparatus according to a first exemplary embodiment of the present invention.
Figure 2:
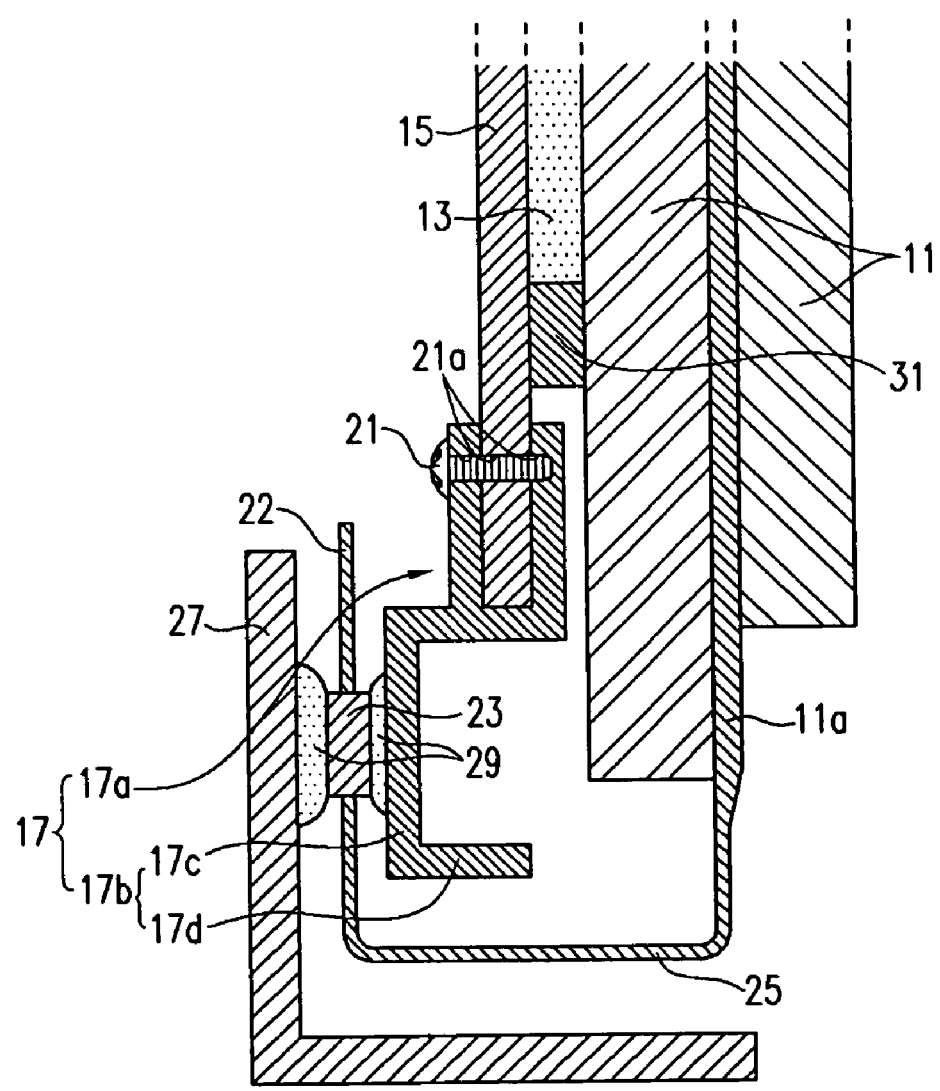
FIG. 2 is a sectional view, taken along line II-II of FIG. 1, of the assembled plasma display apparatus.
Figure 3:
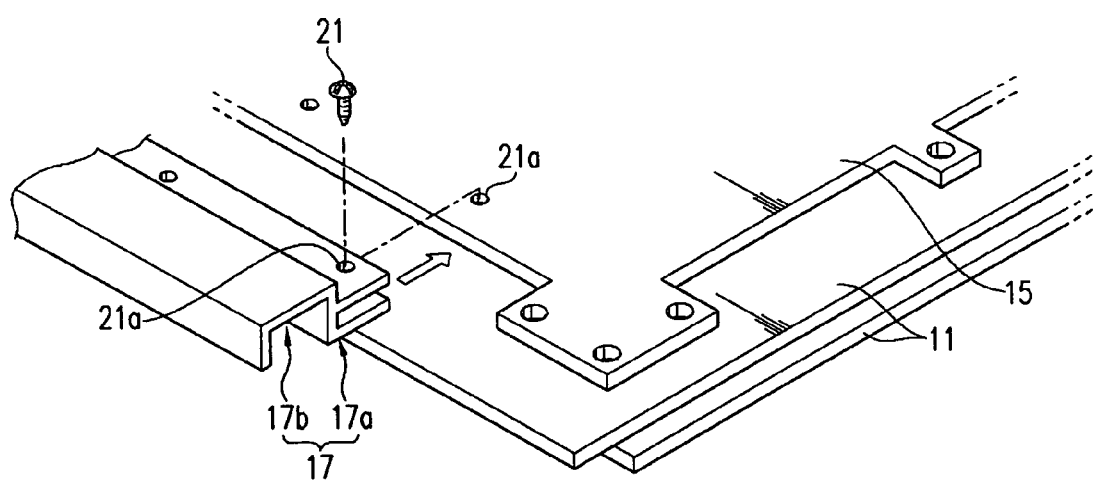
FIG. 3 is a fragmentary perspective view of the first exemplary embodiment, in which a reinforcing unit has been removed from a chassis base.

FIG. 1 is an exploded perspective view of a plasma display apparatus according to a first exemplary embodiment of the present invention, FIG. 2 is a sectional view, taken along line II-II of FIG. 1, of the assembled plasma display apparatus, and FIG. 3 is a fragmentary perspective view of the first exemplary embodiment, in which a reinforcing unit has been removed from a chassis base.

The plasma display apparatus includes a PDP 11 that displays images using a gas discharge, and that has front and rear surfaces. Thermally conductive sheets 13 are attached to the rear surface of the PDP 11. Heat is generated by the gas discharge within the PDP, and the thermally conductive sheets 13 disperse the heat in a planar direction of the PDP 11. The plasma display apparatus further includes a chassis base 15 attached to the rear surface of the PDP 11.

The present invention is related to the interconnection between the PDP 11 and structural elements in the periphery of the PDP 11. Therefore, a detailed description of the PDP 11 itself has been omitted. The PDP 11 of the present invention is assumed to include various different configurations and drive methods therefor.

The thermally conductive sheets 13 are attached to the rear surface of the PDP 11 as described above so that the heat of the PDP is uniformly distributed. That is, the thermally conductive sheets 13 quickly disperse the heat of the PDP 11 in the planar direction thereof. The thermally conductive sheets 13 can be made of a variety of different materials, such as silicon, urethane, acryl, graphite, metal, or carbon nano-tube material.

The chassis base 15 is also attached to the rear surface of the PDP 11, i.e., to the side to which the thermally conductive sheets 13 are attached. The chassis base 15 supports the PDP 11, which is typically made of glass, to thereby increase the mechanical strength of the PDP 11. Furthermore, the chassis base 15 emits the heat distributed by the thermally conductive sheets 13 into the air, thereby making the operation of the PDP 11 more stable. To perform these operations, the chassis base 15 is preferably made of a material with a high thermal conductivity, such as aluminum or another metal.

A circuit board assembly 16 is attached to a side of the chassis base 15 opposite that to which the PDP 11 is attached. The chassis base 15 is formed to ground the circuit board assembly 16 as well as to reduce ElectroMagnetic Interference (EMI) generated by the circuit board assembly 16.

The chassis base 15 must be both lightweight and sufficiently strong to support the PDP 11. To satisfy these conflicting requirements, the chassis base 15 is preferably formed of a flat plate obtained by pressing a thin metal plate. This flat plate formation allows for easy manufacture of the chassis base 15.

The plasma display apparatus of the present invention further includes reinforcing units 17. The reinforcing units 17 increase the mechanical strength of chassis base 15, in addition to maintaining a high level of flatness for the chassis base 15. In the description of the present invention, the level of flatness refers to an initial level of flatness of the chassis base 15 without any deformation thereof.

The reinforcing units 17 are provided along edge portions of the chassis base 15. In more detail, the chassis base 15 is substantially a rectangular shape having two long edge portions and two short edge portions, and the reinforcing units 17 are attached to at least one edge portion of the chassis base 15. The chassis base 15, which supports the PDP 11, is therefore strengthened so that it is able to withstand bending and twisting loads. If the reinforcing units 17 were attached to all of the edge portions of the chassis base 15, then the weight of the chassis base 15 would be increased excessively. Accordingly, the reinforcing units 17 are preferably only attached to the two long edge portions of the chassis base 15.

The reinforcing units 17 are formed separately from the chassis base 15 and attached to the edge portion(s) thereof as described above. Accordingly, the initial level of flatness of the chassis base 15 is maintained. Furthermore, the reinforcing units 17 add additional mechanical strength to the chassis base 15.

Referring to FIGS. 2 and 3, each of the reinforcing units 17 includes a connecting portion 17a connected to a respective one of the edge portions of the chassis base 15, and a reinforcing portion 17b extending outwardly and integrally from the connecting portions 17a in a direction away from the chassis base 15. A driver IC 23 of a TCP 22 is in close contact to the reinforcing portion 17b. The TCP 22 is coupled to an electrode 11a of the PDP 11 via an FPC 25, and a drive voltage is supplied to the electrode 11a.

For each of the reinforcing units 17, the connecting portion 17a is directly connected to one of the edge portions of the chassis base 15, and the reinforcing portion 17b increases the mechanical strength of the chassis base 15 when the connecting portion 17a is connected thereto. Since the connecting portion 17a of the reinforcing unit 17 is connected to the corresponding edge portion of the chassis base 15, the corresponding edge portion of the chassis base 15 is formed into a plurality of layers without adversely affecting the flatness of the chassis base 15. Therefore, the strength of the chassis base 15 is increased without bending the edge portion of the same. That is, the combination of the connecting portion 17a and the edge portion of the chassis base 15 inserted therein is formed into a three-layer structure to thereby increase the ability of the chassis base 15 to withstand bending and twisting loads. In addition, the reinforcing portion 17b of the reinforcing unit 17 is curved to have various cross-sectional formations. Through such a structure of the reinforcing portion 17b, the strength of the chassis base 15 is further increased.

The reinforcing unit 17 can be connected to the corresponding edge portion of the chassis base 15 by various different structures depending on the formation of the connecting portion 17a. In this embodiment, the reinforcing unit 17 is forcibly inserted over the edge portion of the chassis base 15, and a fastener 21 is screwed into the connecting portion 17a and through the edge portion of the chassis base 15. Such a configuration allows for a secure connection of the reinforcing unit 17 to the chassis base 15. The fastener 21 can be a threaded bolt/screw or a rivet, or can employ a sheet metal fastening method, such as the TOX method.

Describing the structure of each of the reinforcing units 17 in greater detail, with reference to FIGS. 2 and 3, the connecting portion 17a has a U-shaped cross-section. The connecting portion 17a is inserted over the corresponding edge portion of the chassis base 15 to thereby support both sides thereof and obtain a more stable structure. Furthermore, the connecting portion 17a is preferably forcibly inserted over the respective edge portion of the chassis base 15, and, more preferably, the fastener 21 is used for the connection of the connecting portion 17a to the chassis base 15. A fastening hole 21a is formed in the connecting portion 17a and in the edge portions of the chassis base 15 for connection of the fastener 21 to the chassis base 15. The fastening hole 21a is configured as a screw hole in the case where the fastener 21 is a threaded screw or bolt.

The reinforcing portion 17b of each of the reinforcing units 17 can include a parallel section 17c, and further include an end section 17d. The parallel section 17c extends from a lower end of the connecting portion 17a in a direction substantially parallel to the PDP 11, and the end section 17d extends from a lower end of the parallel section 17c substantially perpendicular to the parallel section 17c and toward the PDP 11. The parallel section 17c is formed to allow a stable connection of the driver IC 23 thereto, and to allow heat generated during the operation of the PDP 11 to be dispersed. As described above, the TCP 22 is coupled to the electrode 11a of the PDP 11 via the FPC 25, and a drive voltage is supplied to the electrode 11a. The end section 17d is formed to allow a connection between the TCP 22 and the electrode 11a of the PDP 11 via the FPC 25 such that the FPC 25 is not positioned between the reinforcing unit 17 and the PDP 11.

Cover plates 27 are positioned on the outside of each of the reinforcing units 17. Each cover plate 27 presses the driver IC 23 attached to the TCP 22 toward the reinforcing portion 17b, so that the driver IC 32 is pressed against the reinforcing portion 17b. Thermal conductive material 29 is interposed between the driver IC 23 and the reinforcing portion 17b, as well as between the driver IC 23 and the cover plate 27. The thermal conductive material 29 prevents the formation of an air layer, which operates as thermal resistance, between the driver IC 23 and the elements adjacent therewith. Furthermore, the thermal conductive material 29 is made of a material with a high thermal conductivity such that heat generated by the driver IC 23 is quickly transmitted to the reinforcing units 17 and the cover plates 27. In addition, the thermal conductive material 29 is preferably made of a material that is able to absorb shock to thereby prevent damage to the driver IC 23 in the event that the plasma display apparatus receives an external shock. The thermal conductive material 29 adjacent to the reinforcing units 17 can be thermal grease or silicone, and the thermal conductive material 29 adjacent to the cover plates 27 can be thermal conductive sheets.

Second through sixth exemplary embodiments, respectively shown in FIGS. 4 to 8, have structures and operate similarly or identically to the first exemplary embodiment. Therefore, only aspects of the second through sixth exemplary embodiments that differ from those of the first exemplary embodiment are described below.

Figure 4:
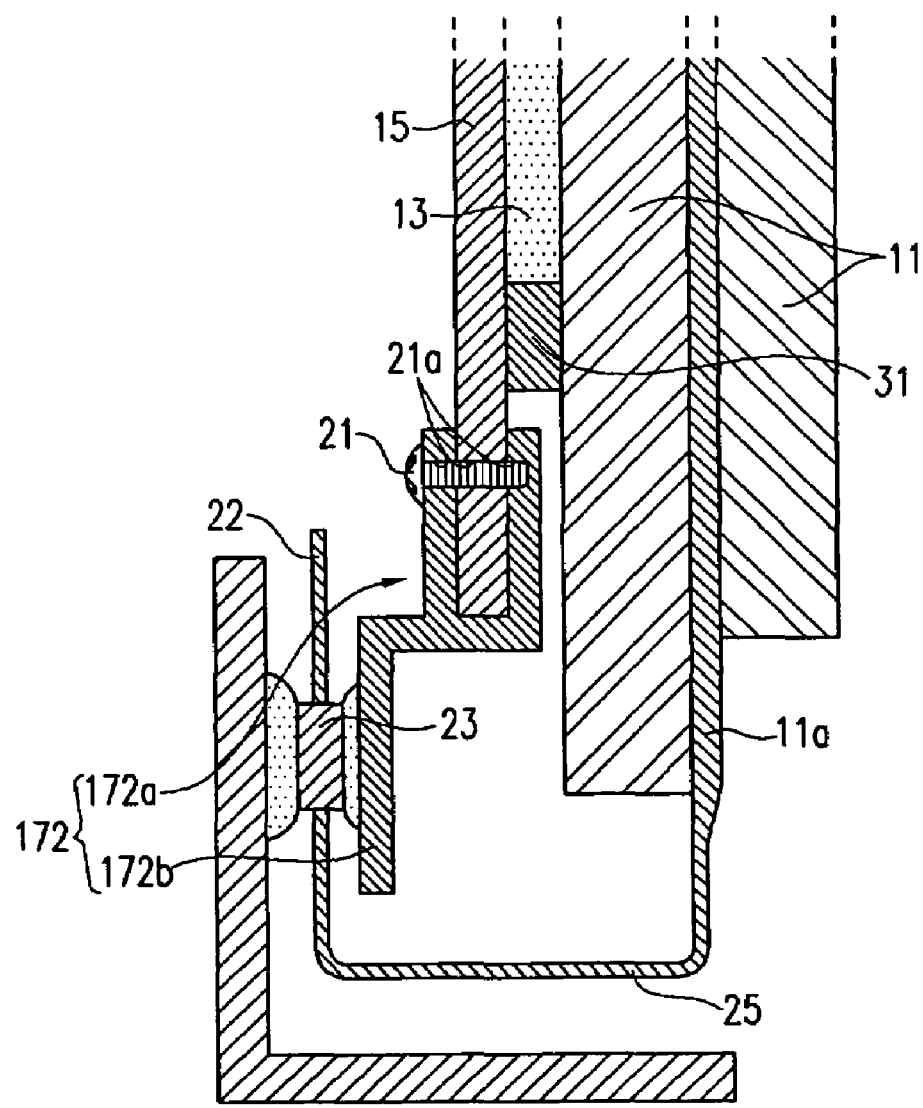
FIG. 4 is a fragmentary sectional view of a plasma display apparatus according to a second exemplary embodiment of the present invention.
Figure 5:
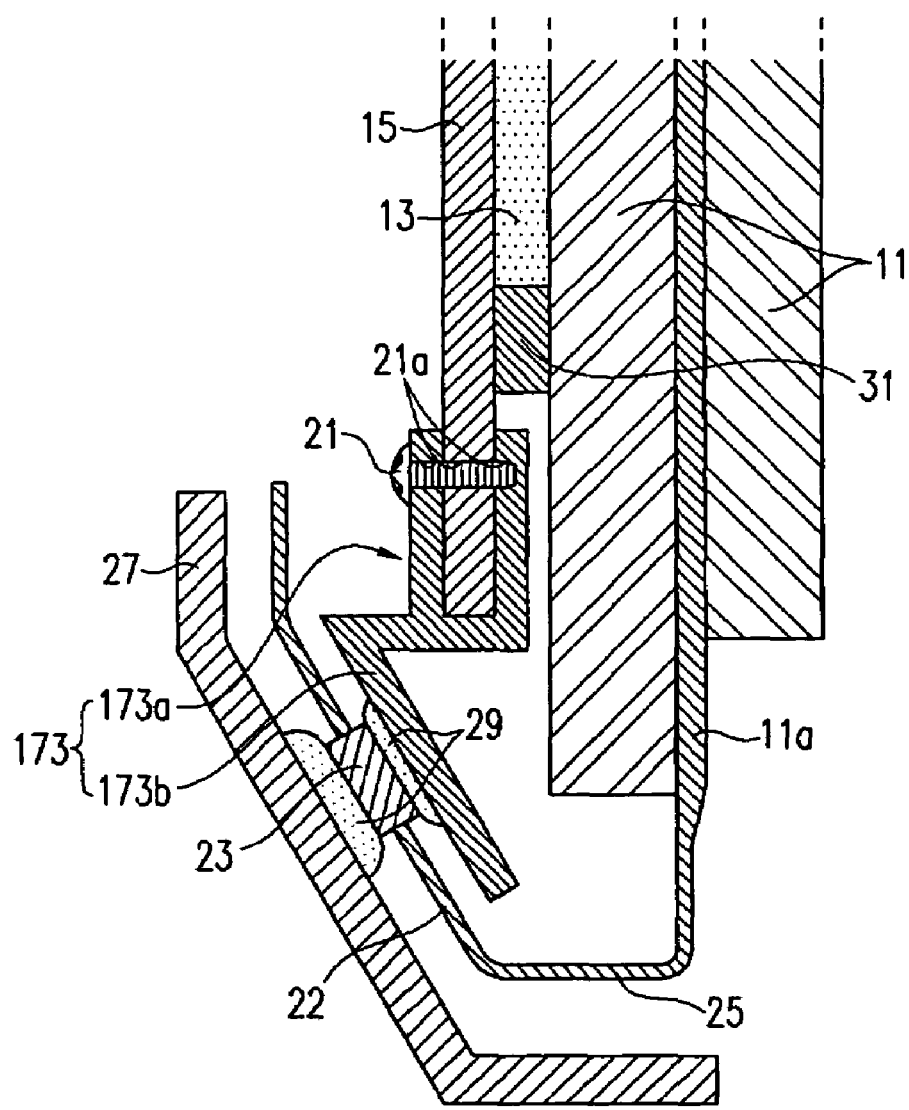
FIG. 5 is a fragmentary sectional view of a plasma display apparatus according to a third exemplary embodiment of the present invention.

Referring to FIG. 4, a reinforcing portion 172b of a reinforcing unit 172 includes a parallel section that extends from a lower end of a connecting portion 172a in a direction substantially parallel to the PDP 11. Referring to FIG. 5, a reinforcing portion 173b of a reinforcing unit 173 includes an inclined section that extends from a lower end of a connecting portion 173a inclined with respect to a planar direction of the PDP 11.

When compared to the first exemplary embodiment, the reinforcing portion 172b of the second exemplary embodiment of FIG. 4 provides slightly less reinforcing strength to the chassis base 15 but is lighter in weight. When compared to the first exemplary embodiment, the reinforcing portion 173b of the third exemplary embodiment shown in FIG. 5 allows for a structure having a decreased length for the FPC 25 that interconnects the electrode 11a of the PDP 11 and the TCP 22.

Figure 6:
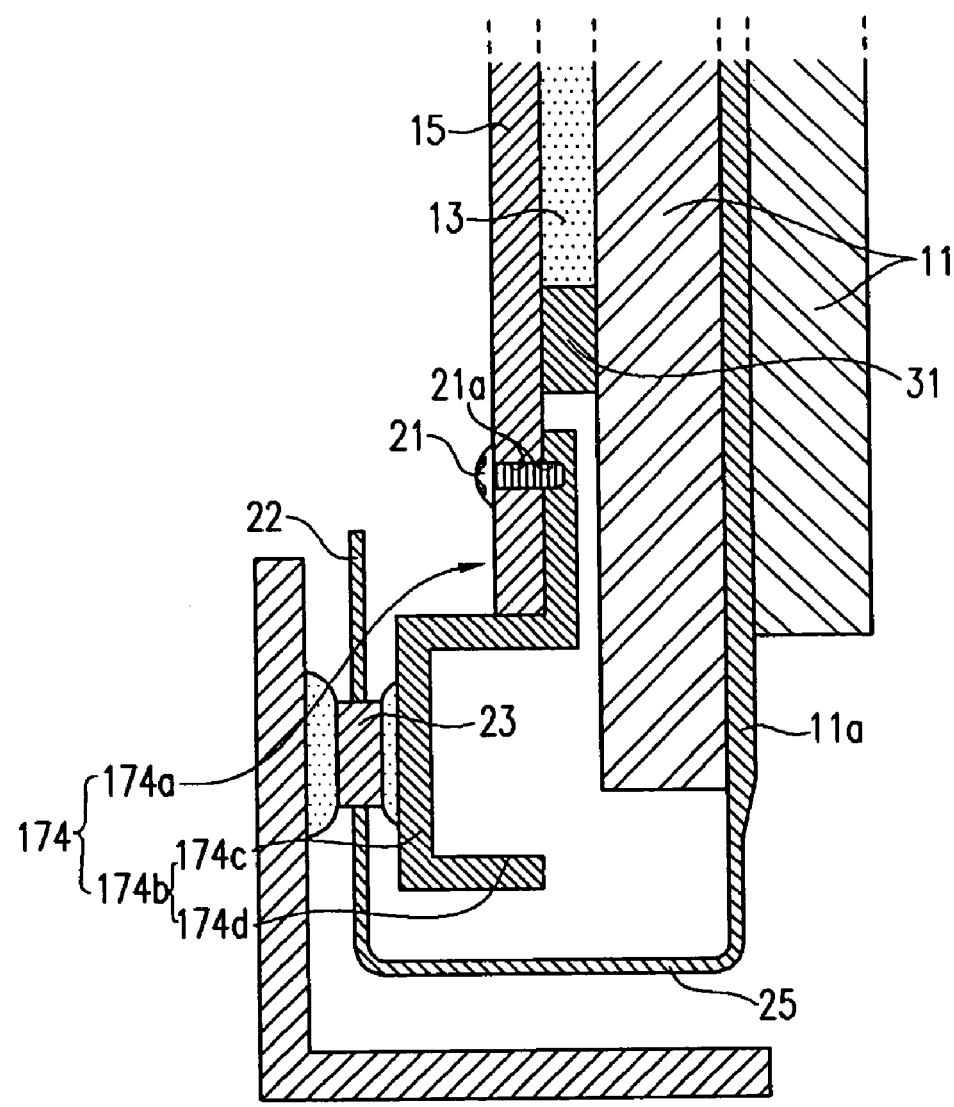
FIG. 6 is a fragmentary sectional view of a plasma display apparatus according to a fourth exemplary embodiment of the present invention.
Figure 7:
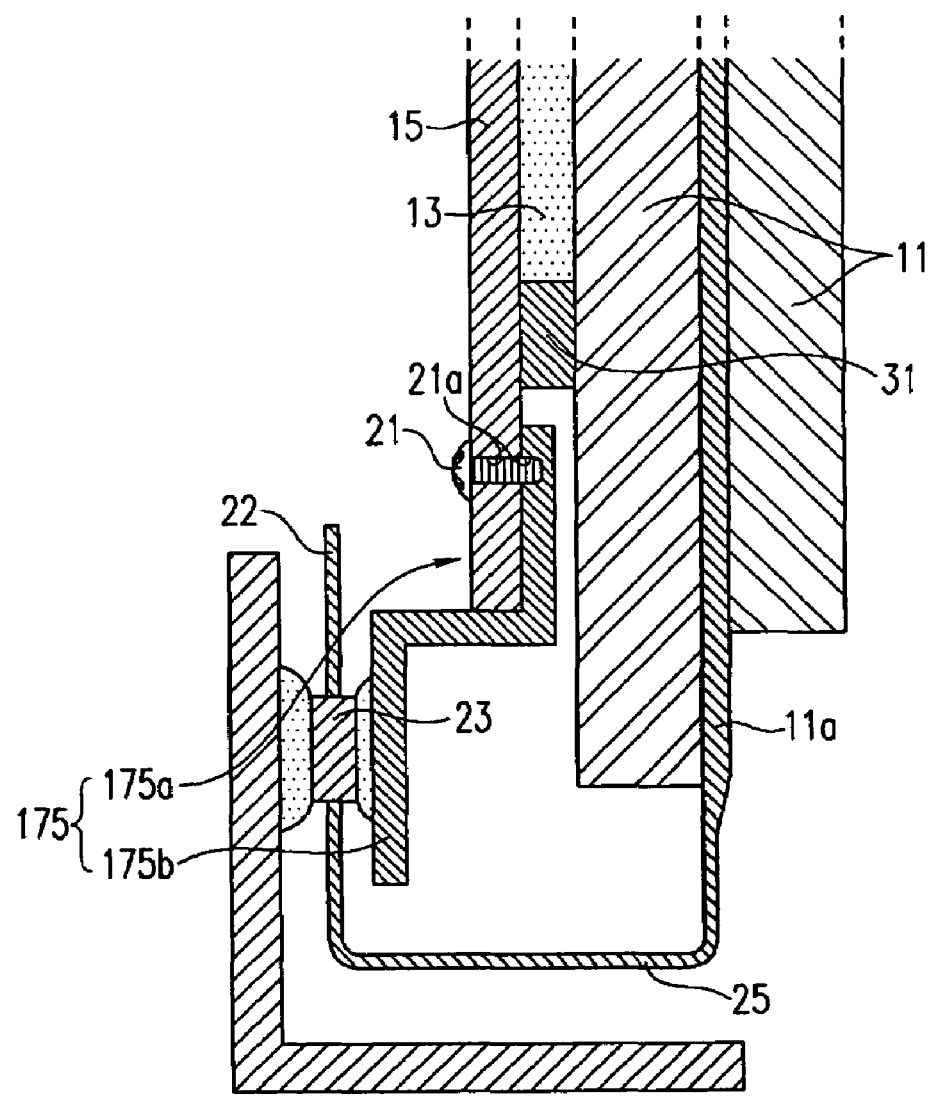
FIG. 7 is a fragmentary sectional view of a plasma display apparatus according to a fifth exemplary embodiment of the present invention.
Figure 8:
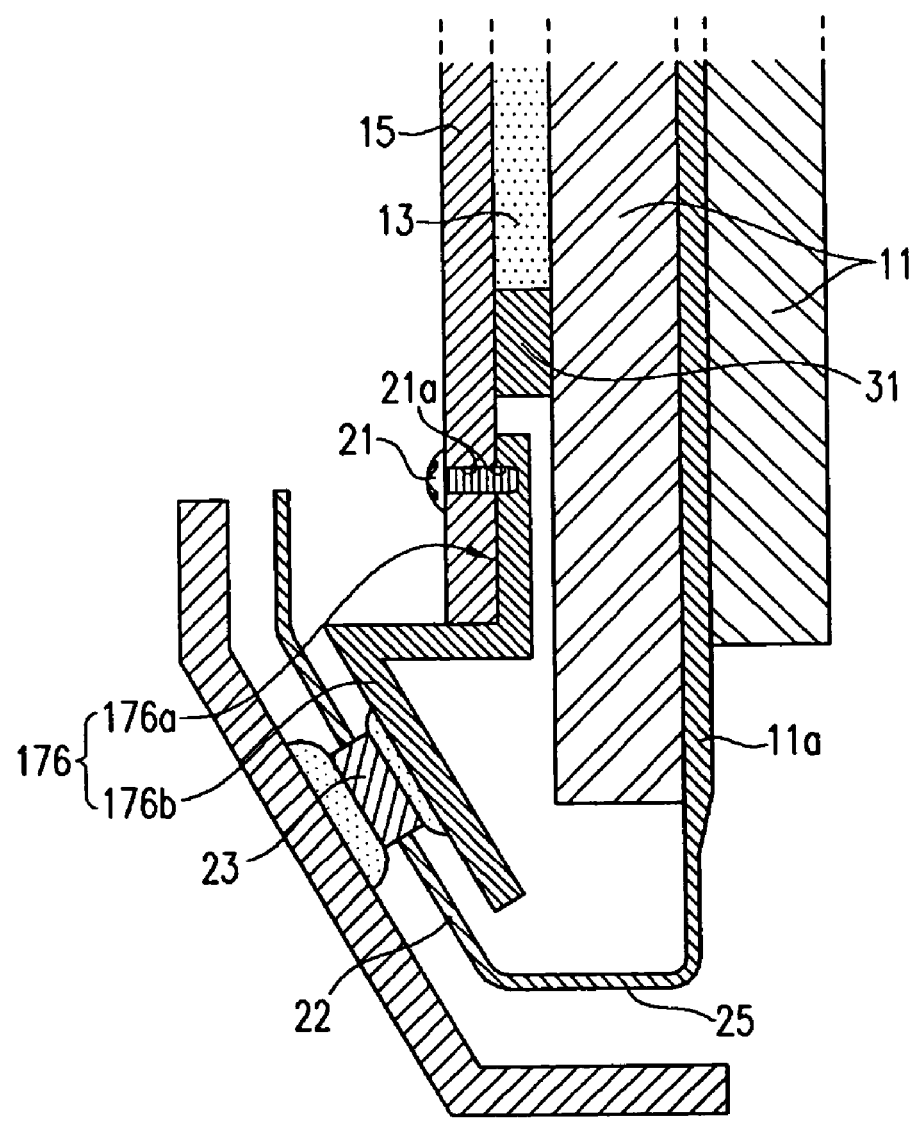
FIG. 8 is a fragmentary sectional view of a plasma display apparatus according to a sixth exemplary embodiment of the present invention.

The fourth through sixth exemplary embodiments respectively shown in FIGS. 6-8 include reinforcing portions 174b, 175b, and 176b with the same structure as the reinforcing portions 17b, 172b, and 173b respectively of the first through third embodiments. However, connecting portions 174a, 175a, and 176a are different. In particular, the connecting portions 174a, 175a, and 176a of reinforcing units 174, 175, and 176, respectively, are connected to only one side of the respective edge portion of the chassis base 15, rather than being formed in a U-shape and inserted overlapping both sides of the respective edge portion of the chassis base 15 as in the first through third exemplary embodiments.

Accordingly, the connecting portions 174a,175a, and 176a of the fourth through sixth exemplary embodiments support only one side of the corresponding edge portion of the chassis base 15. To secure the connection, a fastener 21 is preferably used to connect each of the connecting portions 174a, 175a, and 176a to the corresponding edge portion of the chassis base 15.

Although the connecting portions 174a, 175a, and 176a are shown connected to the surface of the chassis base 15 opposing the PDP 11, it is to be understood that the connection can also be to the opposite side of the chassis base 15.

With respect to all of the embodiments described thus far, the PDP 11 and the chassis base 15 are attached to each other using two-sided adhesive tape 31. That is, the two-sided adhesive tape 31 is positioned between the PDP 11 and the chassis base 15, and interposed between outer peripheries of the thermal conductive sheets 13 and the connecting portions 17a, 172a, 173a, 174a, 175a, and 176a.

Figure 9:
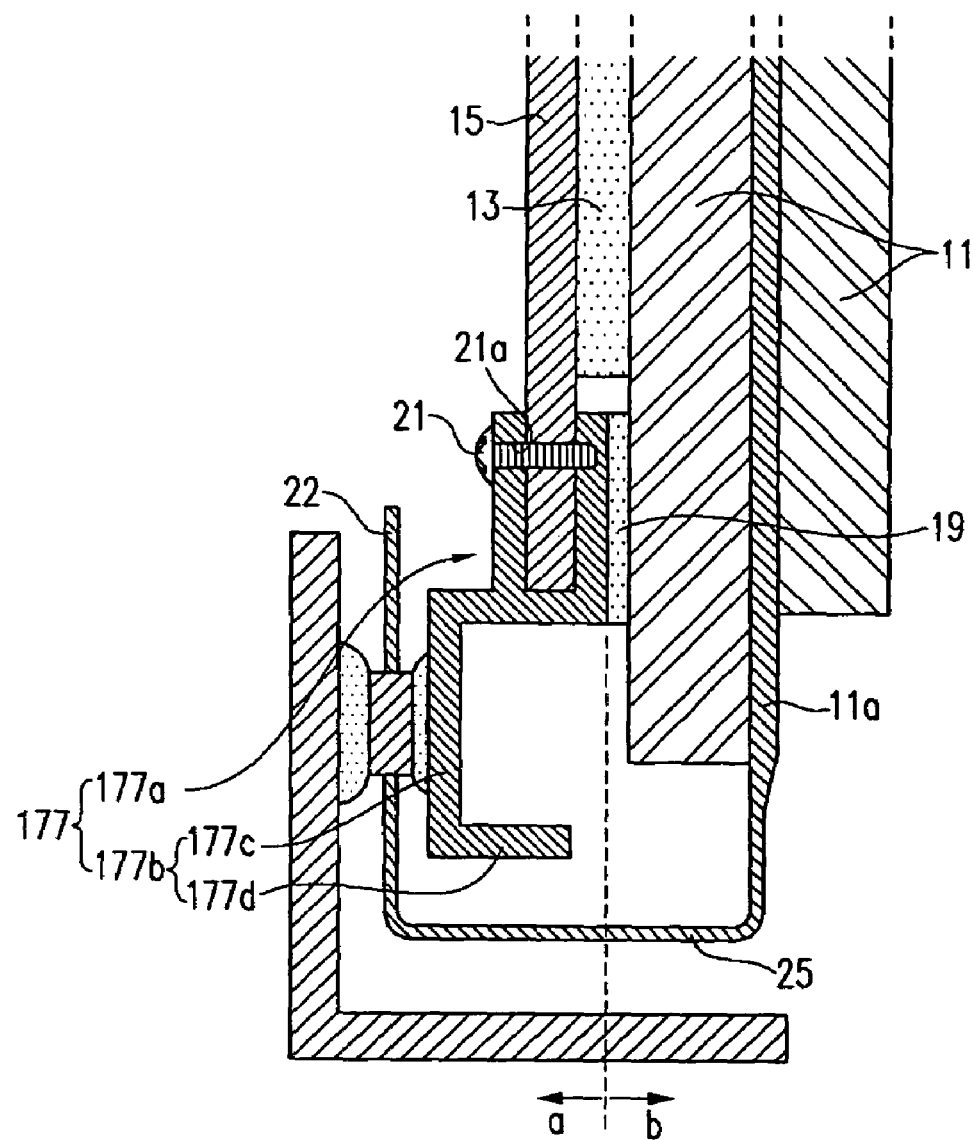
FIG. 9 is a fragmentary sectional view of a plasma display apparatus according to a seventh exemplary embodiment of the present invention.

With reference to FIG. 9, a plasma display apparatus according to a seventh exemplary embodiment of the present invention is similar in structure to that of the first exemplary embodiment. However, rather than the two-sided adhesive tape 31 for attachment between the chassis base 15 and the PDP 11, an attachment member 19 is used to attach a reinforcing unit 177 to the PDP 11. The reinforcing unit 177 includes one portion for reinforcing the strength of the chassis base 15, and another portion for disconnecting and connecting the PDP 11 to the chassis base 15. These portions are formed integrally.

Furthermore, the reinforcing unit 177 and the chassis base 15 can be connected by the fastener 21. The PDP 11 and the chassis base 15 can be integrally connected and separated by fastening and unfastening the fastener 21.

The attachment member 19 is interposed between the reinforcing unit 177 and the PDP 11 facing the reinforcing unit 177 to interconnect these elements. The attachment member 19 is positioned on the outside of the thermal conductive sheets 13. In order to enable the secure attachment between the thermal conductive sheets 13 and the PDP 11, the attachment member 19 preferably does not overlap the thermal conductive sheets 13. The attachment member 19 can include two-sided adhesive tape.

The reinforcing unit 177 can be connected to the chassis base 15 or disconnected therefrom by the attachment member 19 and the fastener 21. That is, when the reinforcing unit 177 and the PDP 11 are connected by the attachment member 19, if the fastener 21 is used to connect the reinforcing unit 177 and the chassis base 15, the PDP 11 and the chassis base 15 integrally form the plasma display apparatus. Furthermore, if the fastener 21 is disconnected, the chassis base 15 can be removed from the reinforcing unit 177, thereby allowing separation of the plasma display apparatus in a direction (a) toward the chassis base 15 and in a direction (b) toward the PDP 11.

Eighth through twelfth exemplary embodiments shown respectively in FIGS. 10 to 14 have structures and operate similarly or identically to the seventh exemplary embodiment. Therefore, only aspects of the eighth through twelfth exemplary embodiments that differ from those of the seventh exemplary embodiment are described below.

Figure 10:
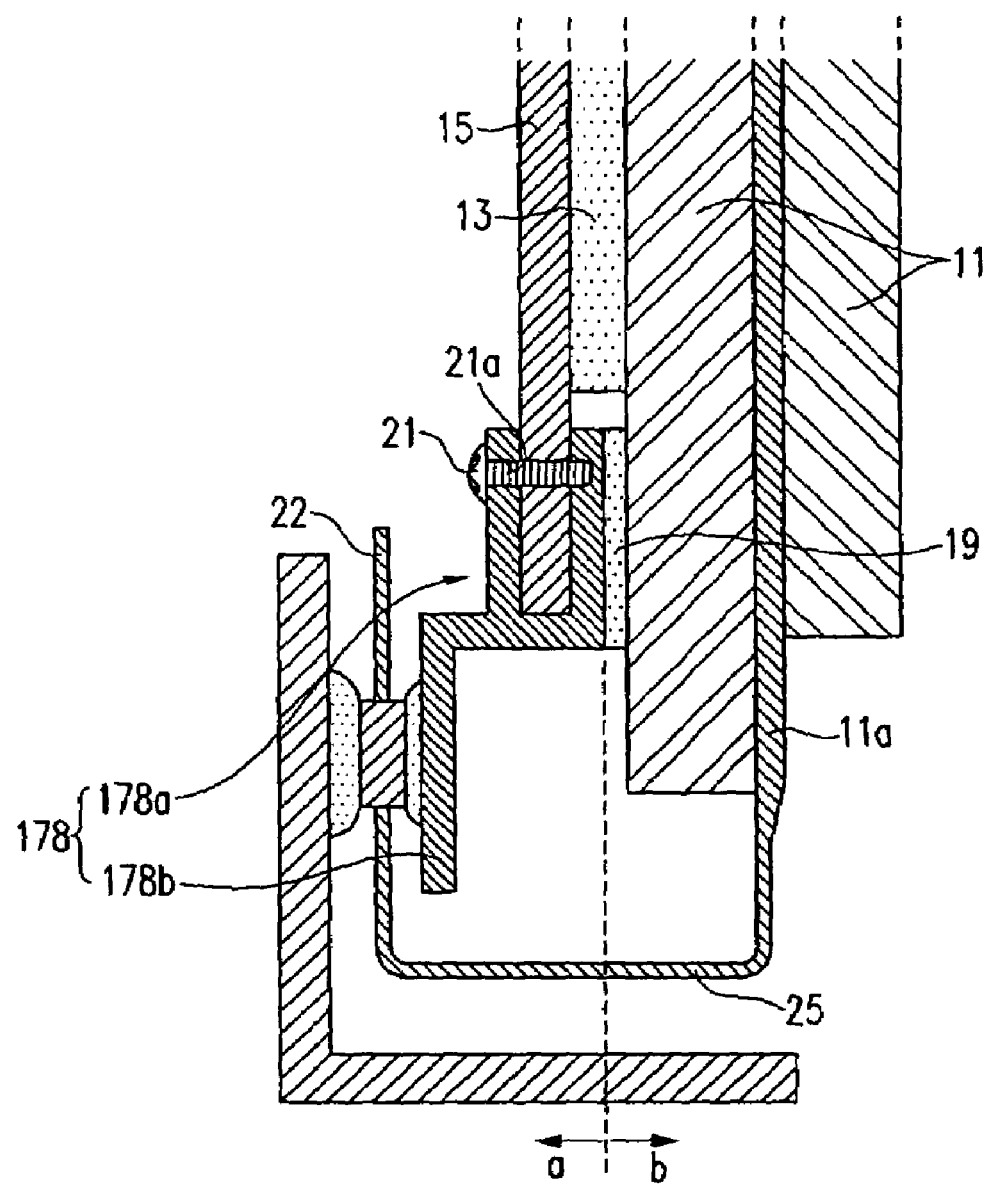
FIG. 10 is a fragmentary sectional view of a plasma display apparatus according to an eighth exemplary embodiment of the present invention.
Figure 11:
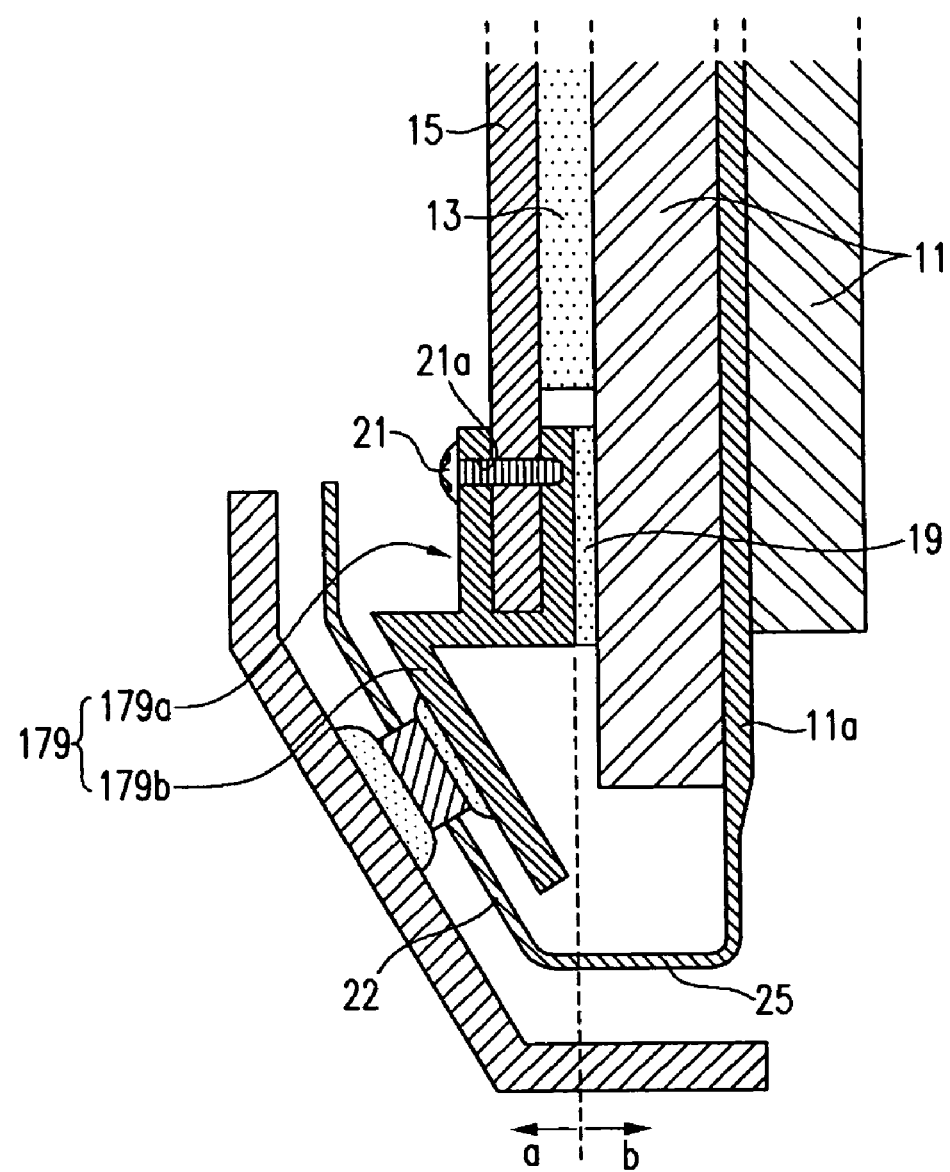
FIG. 11 is a fragmentary sectional view of a plasma display apparatus according to a ninth exemplary embodiment of the present invention.

When compared to the seventh exemplary embodiment, a reinforcing portion 178b of the eighth exemplary embodiment of FIG. 10 does not include an end section, and instead includes only a parallel section. A reinforcing portion 179a of the ninth exemplary embodiment of FIG. 11 includes an inclined section 179b.

When compared to the seventh exemplary embodiment, the reinforcing portion 178b of the eighth exemplary embodiment of FIG. 10 provides slightly less reinforcing strength to the chassis base 15, but is lighter in weight and makes the structure of the reinforcing unit 178 less complicating while having a sufficient level of structural strength. The reinforcing portion 179b of the ninth exemplary embodiment of FIG. 11 allows for a structure of decreased length for the FPC 25 that interconnects the electrode 11a of the PDP 11 and the TCP 22.

Figure 12:
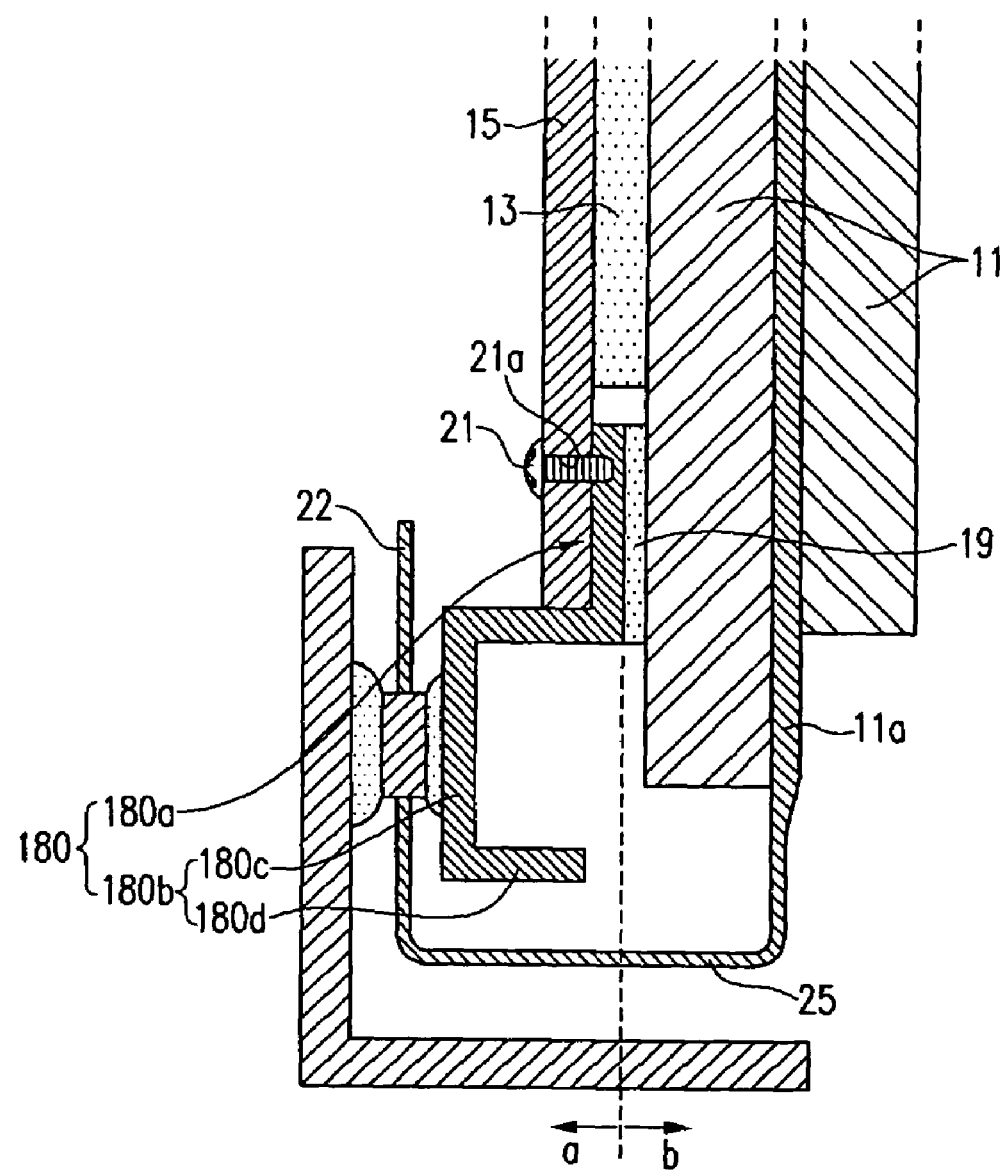
FIG. 12 is a fragmentary sectional view of a plasma display apparatus according to a tenth exemplary embodiment of the present invention.
Figure 13:
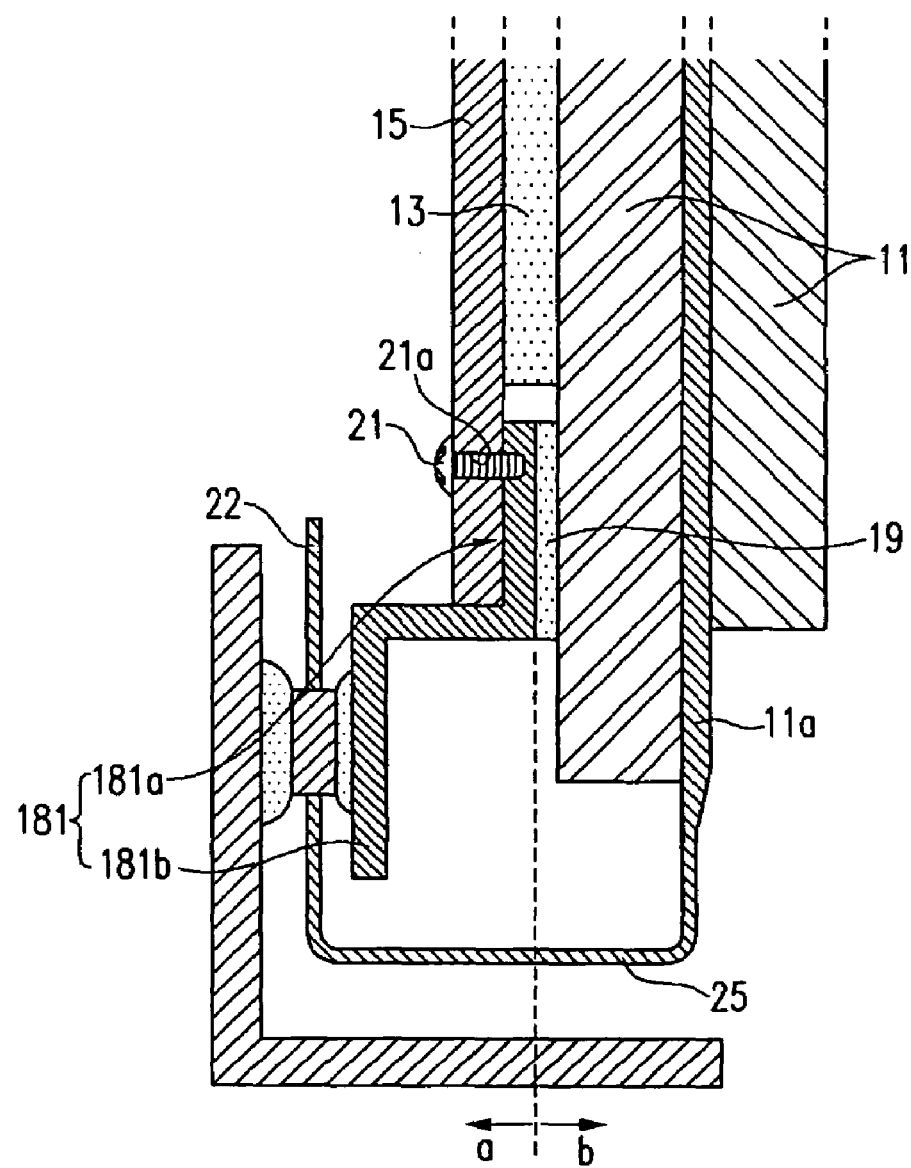
FIG. 13 is a fragmentary sectional view of a plasma display apparatus according to an eleventh exemplary embodiment of the present invention.
Figure 14:
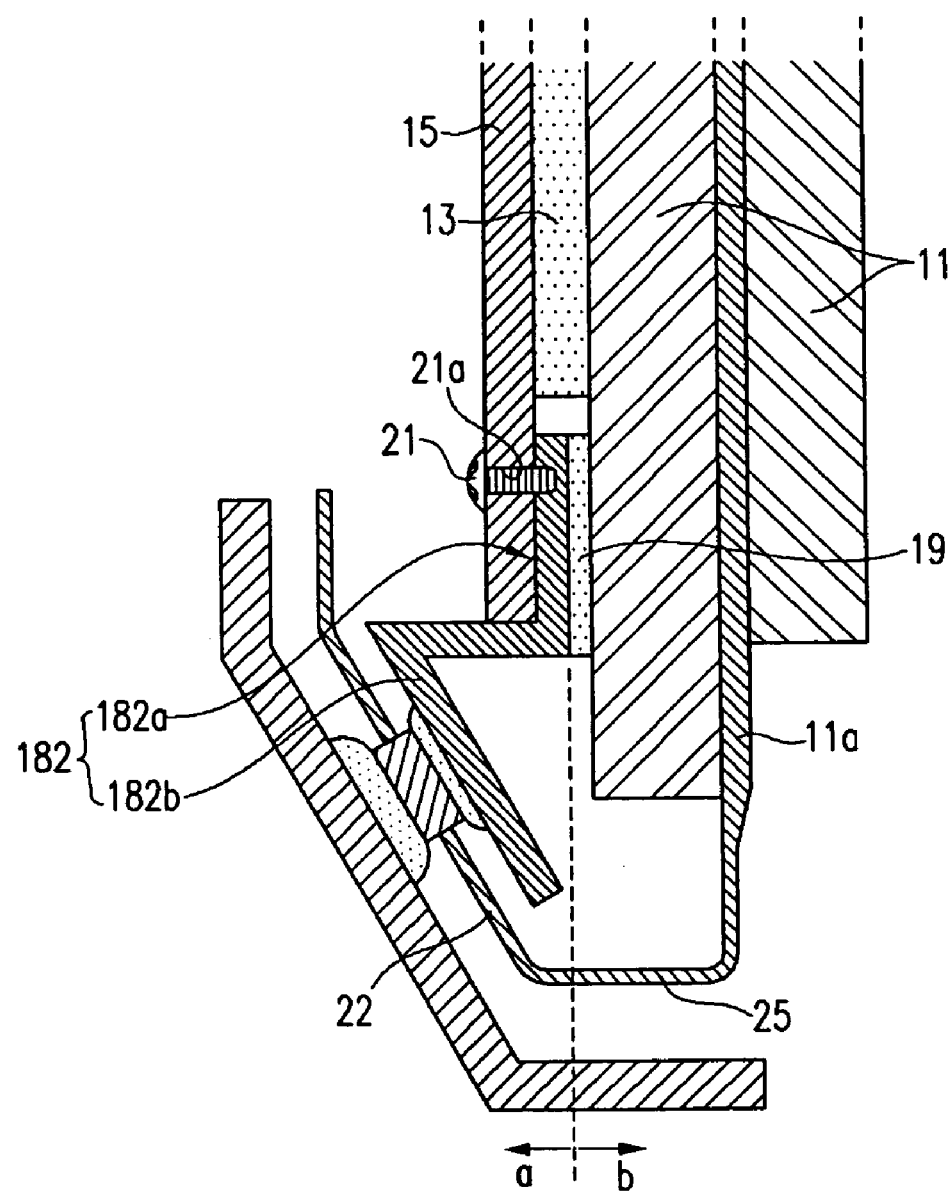
FIG. 14 is a fragmentary sectional view of a plasma display apparatus according to a twelfth exemplary embodiment of the present invention.

The tenth through twelfth exemplary embodiments shown respectively in FIGS. 12 to 14 include reinforcing portions 180b, 181b, and 182b with the same structure as the reinforcing portions 177b, 178b, and 179b respectively of the seventh through ninth exemplary embodiments. However, connecting portions 180a, 181a, and 182a are different from those of the seventh through ninth exemplary embodiments. In particular, the connecting portions 180a, 181a, and 182a of reinforcing units 180, 181, and 182, respectively, are connected to only one side of the respective edge portion of the chassis base 15 (i.e., between the chassis base 15 and the PDP 11), rather than being formed in a U-shape and inserted overlapping both sides of the respective edge portion of the chassis base 15 as in the seventh through ninth exemplary embodiments. To secure the connection, a fastener 21 is preferably used to connect each of the connecting portions 180a, 181a, and 182a to the corresponding edge portion of the chassis base 15. In this case, the attachment member 19 is interposed between the connecting portions 180a, 181a, and 182a and the PDP 11 for attachment to these elements.

In the plasma display apparatus of the present invention described above, the outer portions of the chassis base are formed in a flat configuration and bending thereof is unneeded. Reinforcing units that are manufactured separately are instead used that can be attached to and separated from the chassis base. Through the use of the reinforcing units, the structural strength of the chassis base is ensured and its flatness is maintained.

Furthermore, through the use of the reinforcing units, assembly and disassembly of the chassis base to the PDP can be easily performed. Still furthermore, the driver IC of the TCP is attached to the reinforcing units such that a separate heat-emitting member for the emission of heat from the driver IC is unneeded. Therefore, the structure of the chassis base is further simplified.

Although embodiments of the present invention have been described in detail hereinabove, it should be clearly understood that many variations and/or modifications of the basic inventive concepts herein taught which can appear to those skilled in the present art will still fall within the spirit and scope of the present invention, as defined by the appended claims.

What is claimed is:

1. A plasma display apparatus, comprising:
a Plasma Display panel (PDP);
a thermal conductive sheet attached to one side of the PDP;
a chassis base attached to the thermal conductive sheet, the chassis base being a planar plate having edge portions;
at least one reinforcing unit extending along and mounted to at least one of the edge portions of the chassis base; and
a driver IC mechanically connected to the at lease one reinforcing unit.

2. The plasma display apparatus of claim 1, wherein the at least one reinforcing unit includes a connecting portion connected to the respective one of the edge portions of the chassis base, and a reinforcing portion in a bent configuration and extending from the connecting portion in a direction away from the PDP.

3. The plasma display apparatus of claim 2, wherein the connectingportion is U-shaped and connected to the respective one of the edge portions of the chassis base by being forcibly inserted over the respective one of the edge portions to support the respective one of the edge portions on both sides thereof.

4. The plasma display apparatus of claim 3, wherein the connecting portion is connected to the respective one of the edge portions with a fastener.

5. The plasma display apparatus of claim 3, wherein the reinforcing portion includes a section extending along a direction parallel to the PDP from an end of the connecting portion.

6. The plasma display apparatus of claim 3, wherein the reinforcing portion includes a parallel section extending along a direction parallel to the PDP from an end of the connecting portion, and an end section extending from the parallel section in a direction toward the chassis base.

7. The plasma display apparatus of claim 3, wherein the reinforcing portion includes a section extending from an end of the connecting portion in a direction inclined with respect to a planar direction of the PDP.

8. The plasma display apparatus of claim 2, wherein the connecting portion is disposed between the PDP and the respective one of the edge portions of the chassis base, and is connected to the chassis base with a fastener.

9. The plasma display apparatus of claim 8, wherein the reinforcing portion includes a section extending along a direction parallel to the PDP from an end of the connecting portion.

10. The plasma display apparatus of claim 8, wherein the reinforcing portion includes a parallel section extending along a direction parallel to the PDP from an end of the connecting portion, and an end section extending from the parallel section in a direction toward the chassis base.

11. The plasma display apparatus of claim 8, wherein the reinforcing portion includes a section extending from an end of the connecting portion in a direction inclined with respect to a planar direction of the PDP.

12. The plasma display apparatus of claim 2, further comprising two-sided adhesive tape arranged between the PDP and the chassis base, and interposed between and attached to both an outer periphery of the thermal conductive sheet and the connecting portion.

13. A plasma display apparatus, comprising:
a Plasma Display Panel (PDP);
a thermal conductive sheet attached to one side of the PDP;
a chassis base attached to the thermal conductive sheet, the chassis base having edge portions;
at least one reinforcing unit attached to at least one of the edge portions of the chassis base by a fastener;
an attachment member interposed between and attached to both the at least one reinforcing unit and the PDP facing the reinforcing unit, and positioned outside of the thermal conductive sheet; and
a driver IC mechanically connected to the at least one reinforcing unit.

14. The plasma display apparatus of claim 13, wherein the chassis base is a planar plate.

15. The plasma display apparatus of claim 14, wherein the at least one reinforcing unit includes a connecting portion connected to the respective one of the edge portions of the chassis base with the fastener, and a bent reinforcing portion extending from the respective one of the connecting portions in a direction away from the PDP.

16. The plasma display apparatus of claim 15, wherein the connecting portion is U-shaped and supports both sides of the respective one of the edge portions of the chassis base, the connecting portion being connected to the chassis base with the fastener.

17. The plasma display apparatus of claim 16, wherein the attachment member is interposed between and attached to both the connecting portion and the PDP.

18. The plasma display apparatus of claim 16, wherein the reinforcing portion includes a section extending along a direction parallel to the PDP from an end of the respective one of the connecting portions.

19. The plasma display apparatus of claim 16, wherein the reinforcing portion includes a parallel section extending along a direction parallel to the PDP from an end of the respective one of the connecting portions, and an end section extending from the parallel section in a direction toward the chassis base.

20. The plasma display apparatus of claim 16, wherein the reinforcing portion includes a section extending from an end of the respective one of the connecting portions in a direction inclined with respect to a planar direction of the PDP.

21. The plasma display apparatus of claim 16, wherein the connecting portion is arranged between the PDP and the respective one of the edge portions of the chassis base, and is connected to the chassis base with a fastener.

22. The plasma display apparatus of claim 21, wherein the attachment member is interposed between and attached to both the connecting portion and the PDP facing the connecting portion.

23. The plasma display apparatus of claim 21, wherein the reinforcing portion includes a section extending along a direction substantially parallel to the PDP.

24. The plasma display panel of claim 21, wherein the reinforcing portion includes a parallel section extending along a direction parallel to the PDP, and an end section extending from the parallel section in a direction toward the chassis base.

25. The plasma display panel of claim 21, wherein the reinforcing portion includes a section extending in a direction inclined with respect to a planar direction of the PDP.

* * * * *